United States Patent
Galewski et al.

(10) Patent No.: US 6,635,570 B1
(45) Date of Patent: Oct. 21, 2003

(54) PECVD AND CVD PROCESSES FOR WNX DEPOSITION

(76) Inventors: Carl J. Galewski, 170 Aromitas Rd., Aromas, CA (US) 95004; Claude A. Sands, 639 Paco Dr., Los Altos, CA (US) 94024; Hector Velasco, 1163 Park Grove Dr., Milpitas, CA (US) 95035; Lawrence Matthysse, 3433 Buckner Dr., San Jose, CA (US) 95127; Thomas E. Seidel, 965 E. El Camino Real #933, Sunnyvale, CA (US) 94087

( * ) Notice: Subject to any disclaimer, the term of this patent is extended or adjusted under 35 U.S.C. 154(b) by 0 days.

(21) Appl. No.: 09/410,109

(22) Filed: Sep. 30, 1999

(51) Int. Cl.[7] .................................... H01L 21/4763
(52) U.S. Cl. ........................... 438/681; 438/654
(58) Field of Search ............................ 438/681, 680, 438/692, 694, 712, 720, 721, 724, 655, 656, 654, 57; 118/723 ME, 724

(56) References Cited

U.S. PATENT DOCUMENTS

| 5,487,923 A | | 1/1996 | Min et al. |
| 5,916,634 A | * | 6/1999 | Fleming et al. ........... 427/255.2 |
| 6,037,263 A | * | 3/2000 | Chang ........................ 438/712 |
| 6,055,927 A | * | 5/2000 | Shang et al. ......... 118/723 ME |
| 6,182,603 B1 | * | 2/2001 | Shang et al. ......... 118/723 ME |

FOREIGN PATENT DOCUMENTS

WO    WO 98/23389    6/1998

* cited by examiner

Primary Examiner—Wael Fahmy
Assistant Examiner—(Vikki) Hoa B Trinh
(74) Attorney, Agent, or Firm—Donald R. Boys; Central Coast Patent Agency, Inc.

(57) ABSTRACT

Improvements to chemical vapor deposition processes are taught for depositing tungsten nitride in semiconductor manufacturing processes. In one irmproved process $NF_3$ is used as a source of nitrogen, and a plasma is introduced under controlled conditions to control particle formation and lower the temperature at which acceptable films may be produced. In another set of processes substantially pure tungsten is produced by rapid thermal annealing of substantially amorphous tungsten nitride at temperatures lower than achieved in the art, by using hydrogen in the ambient atmosphere. In yet another set of new processes particle formation and step coverage enhancement when using $NH_3$ as a nitrogen source is controlled by limiting the pressure at which source gases mix, by unique wall coating technique, and by controlling chamber wall temperature. In still another set of unique processes a graded film on oxide, starting with tungsten silicide quickly grading to tungsten nitride is produced by introducing silane in the $NH_3$ chemistry under controlled conditions.

11 Claims, 3 Drawing Sheets

PECVD AND CVD PROCESSES FOR WNX DEPOSITION

FIELD OF THE INVENTION

The present invention is in the area of methods and apparatus for processing wafers as a step in manufacturing integrated circuits (ICs), and relates in particular to chemical vapor deposition (CVD) processes for depositing tungsten and alloys and mixtures of tungsten with other elements such as, in particular, silicon and nitrogen, using $NF_3$ and in some cases, $NH_3$ as a gaseous source of nitrogen in the processes.

BACKGROUND OF THE INVENTION

Manufacturing of integrated circuits is historically a procedure of forming thin films and layers of various materials on wafers of base semiconductor material, and then selectively removing areas of the films to produce structures and circuitry. Doped silicon is a typical base wafer material, and in various process schemes, metal layers are formed on the doped silicon or on polysilicon or silicon oxide formed from the base material. It is well known in the art that there are many difficulties in forming thin metal films and in particular in forming such films on non-metallic base materials. Among these difficulties are problems of adhesion and problems related to diffusion and reaction of materials across material boundaries.

There are a number of well-developed technologies for deposition of materials in the ultra-thin layers required for IC fabrication schemes. The deposition techniques can be roughly classed as either physical vapor deposition (PVD) or Chemical Vapor Deposition (CVD) techniques. PVD processes include such processes as evaporation and re-condensation, wherein a material, typically a metal, is heated to a temperature at which the metal melts and vaporizes. The metal then condenses on surfaces generally in line-of sight of the evaporation, forming a film.

Another PVD process is the well-known sputtering process, wherein plasma of usually an inert gas is formed near a target material, and the target is biased to attract ions from the plasma to bombard the target. Atoms of the target material are dislodged by momentum transfer, and form an atomic flux of particles, which coalesce on surrounding surfaces generally in line-of-sight of the target surface eroded by the sputtering process.

PVD processes have distinct advantages for some processes, such as high rate of deposition, and relatively simple coating apparatus. There are drawbacks as well, notably an inherent inability to provide adequate step coverage. That is, on surfaces having concavities as a result of previous coating and etching steps, PVD processes are prone to shadowing effects resulting in local nonuniformity of coating thickness. This problem has grown in importance as device density has increased and device geometry has shrunk in size with multi-level interconnect schemes involving vias and trenches on microscopic scale.

CVD processes comprise deposition from gases injected into a chamber, wherein the gases or components of the gases are chemically decomposed and/or recombined by energy input. In typical CVD processes the substrate to be coated is heated, and gases introduced into a chamber holding the substrate react at or very near the substrate surface in a manner to deposit a film of material on the surface. For example, a film of metallic tungsten may be deposited on a heated substrate surface by flowing Tungsten hexafluoride to the surface in conjunction with a reducing gas such hydrogen. Resulting chemical reaction at a hot substrate surface reduces the tungsten hexafluoride, depositing a film of tungsten on the substrate, and producing HF gas.

It is well-known in the art that there are a wide variety of CVD processes known and available for semiconductor circuit processes, including deposition from organo-metallic materials and plasma-enhanced CVD, wherein energy is added to the process by exciting the gas above the deposition surface with a high-frequency discharge (plasma).

In the fabrication of an integrated circuit, transistors are developed on the surface of a doped silicon substrate. Once transistors are formed, to make a circuit, gates and drains have to be interconnected with electrically conductive tracks. This point in the overall IC fabrication process serves as perhaps the best example of a thin-film interface between a substrate material and an electrically conductive metal.

Over several years in the IC industry, a variety of materials have been tested for interconnecting tracks. Among these are aluminum, titanium. tungsten, and gold. Each has advantages and drawbacks, and different characteristics related to interaction with silicon, electrical conductivity, and electromigration, among others. Also, specific deposition processes have been developed suitable for specific materials. Aluminum, for example is typically deposited by the PVD process of sputtering, and there is currently no commercialized process for CVD deposition of aluminum as an interconnect material. A CVD process, on the other hand, can conveniently deposit tungsten.

There are a variety of known CVD processes employing variations of known chemistries to produce a variety of films of a single element, or a combination of two or more elements. Tungsten is deposited as a continuous (blanket) film on substrates for example to provide, after etching, both via plugs and interconnect tracks between devices implemented in doped silicon. Combinations of tungsten with other elements are deposited for other purposes, such as adhesion and barrier layers on gates of transistors implemented in silicon as an intermediate layer to improve adhesion and combat diffusion, for example, of silicon from the gates into the interconnect film. In these applications the films deposited directly on the gates prior to the interconnect material are called barrier layers.

One of the elements frequently combined with tungsten to provide specific desirable characteristics of a resulting film for adhesion and barrier purposes is Nitrogen to form tungsten nitride. The inventors are aware of conventional chemistry and processes for deposition of $WN_x$ (Tungsten Nitride). In some instances it is desirable to combine tungsten with other elements as well as Nitrogen. One such combination of interest and potential use in gate technology is Tungsten-Silicon-Nitride.

There are also elements competitive to tungsten for gate processes. One of these is Titanium, and materials of interest in combination with Titanium are Titanium Nitride (TiN) and Titanium Silicon Nitride ($Ti_xSi_yN_z$).

The common element among the materials described above is Nitrogen, and perhaps the most common gas utilized as a source of Nitrogen in the CVD processes is ammonia ($NH_3$). It is well known in the art that there are many problems with handling $NH_3$ and mixing $NH_3$ with other gaseous components for CVD processes. One such component is $WF_6$ which, when combined with $NH_3$ at room temperature produces an instantaneous and highly exothermic chemical reaction. Such a gas phase reaction is highly undesirable because it leads to serious complications in CVD reactor design and operation. Also an undesirable gas phase reaction leads to particulate formation, powdery deposits, and poor adhesion of films to the substrate. In addition to this, the instantaneous reaction between $WF_6$ and $NH_3$ leads to coating on the reactor (process chamber) walls. This coating contributes significantly to particles due to peeling, and hence reactors must be completely and periodically cleaned for operation in the actual production environment.

The processes with which the present patent application is concerned pertain to the art of depositing layers of materials typically less than 1 $\mu$m thick, which are used to manufacture semiconductor integrated circuits. These processes are generally termed thin film deposition. The teachings of this disclosure address improvements to the art of chemical vapor deposition (CVD) for thin films consisting generally of the two elements tungsten and nitrogen.

The films in the processes of interest are typically deposited on silicon wafers placed in reaction chambers that provide a highly controlled gaseous ambient atmosphere. Inside these reaction chambers there is apparatus, such as a resistance heated plate, to heat the silicon wafers to provide energy to cause the gases to react to form thin layers on the wafer surface.

Process chambers for such processes are typically attached to a larger chamber, which contains a robotic transfer mechanism also operating under highly controlled ambient atmosphere, usually a high vacuum. The process chambers are typically arranged around a single centrally located robot to allow transfer of wafers between process chambers and load-lock chambers, which are isolated from the larger, general chamber by slit valves. Load-lock chambers are needed to allow introduction of the silicon wafers in to the controlled ambient. The arrangement often ends up looking like a cluster of smaller chambers surrounding a larger central chamber containing the robot, hence the popular term "cluster tool" to describe the type of equipment that is used often used The generic terminology for thin films made up of tungsten and nitrogen is tungsten nitride. The actual films covered by the name tungsten nitride covers a wide range of nitrogen content and morphology. Nitrogen content can vary from a few atomic % to as much as 70 atomic %. The film morphology can range from a fully crystallized structure consisting of grains 10 nm and larger (polycrystalline) to an almost amorphous structure consisting of no long range order at all, or grains less than 1 nm, which is highly nano-crystalline.

Nitrogen in the tungsten nitride film can be bonded in a stochiometric arrangement with tungsten, and also concentrated at discontinuities in the film such as at grain boundaries. When crystallized at least the following phases can be present: W, $W_2N$, WN, or $WN_2$. The relative amounts of these phases in the film depends in part on the relative concentrations of W and N, which in turn can be controlled by adjusting the relative partial pressures of the source gases in the ambient atmosphere during deposition. The most stable phase of crystallized tungsten nitride is $W_2N$. This is also the phase with the lowest electrical resistance which is an important parameter for many applications.

An important application of tungsten nitride films to semiconductor integrated circuit manufacturing is in the role popularly known as a barrier film. The use of barrier films occurs at many steps in the manufacture of semiconductor devices because of a need to achieve stable interaction between dissimilar materials on a microscopic scale, even when exposed to processing temperatures that can range at least as high as 1000° C. The role of the barrier layer is to improve the following specific characteristics for a subsequent film deposition: promote nucleation, increase adhesion, and prevent intermixing. These attributes should in general be obtained by the barrier film while contributing minimally to increased resistance and thickness of the finished structure.

The transition metals in the periodic table are generally suitable as base material for barrier films based on their high melting points and suitable formation of a compound with silicon (silicide). To reduce intermixing due to diffusion aided by defects and grain boundaries the formation of a stable nitride is also a desired characteristic for a barrier film. Elements such as titanium, tantalum, and tungsten are good candidates.

Historically the most commonly used barrier film in the silicon-based semiconductor manufacturing industry is titanium nitride. Tungsten nitride was not thought to have the needed qualities needed by the industry. However, economic progress in the manufacturing industry of integrated circuits is based on continually shrinking the dimensions of the features on these integrated circuits. As the dimensions continue to decrease, the thickness allowed for a barrier layer also decreases. In addition new materials such as copper and tantalum pentoxide ($Ta_2O_5$) may be introduced in to the manufacturing process. These new materials require enhanced requirements of the barrier layers, such as very strong ability to block diffusion in the case of copper, and low tendency to remove oxygen in the case of tantalum pentoxide.

Based on the above, tungsten, as a denser material with lower tendency for oxidation than titanium, has become a potential candidate for several important applications in the industry. These applications include low resistance gate, capacitor electrode, and copper diffusion barriers.

Implementation of tungsten nitride in many potential applications is hindered by the common perception that suitable deposition methods for tungsten nitride may not exist. A survey of the literature of the deposition arts indicates very few papers depositing tungsten nitride by means other than physical sputtering. Few papers deal with chemical vapor deposition methods. Furthermore, the general conclusion of the art appears to be that chemical vapor deposition methods for tungsten nitride, especially those based on the simple reaction with ammonia are not suitable for manufacturing of integrated circuits, because of the extreme reactivity of the constituent gases in such processes that leads to particulate formation.

It is important to note that chemical vapor deposition methods as a class exhibit properties such as production stability and conformality in small features that are desired by the industry. The ability to deposit conformably in small features is very important, especially as the industry need is to shrink the dimensions of features on the integrated circuits. Therefore, it is significant that contrary to common teaching in the art, the present inventors have discovered principles and developed processes that provide several significant improvements to the methods of depositing tungsten nitride by chemical vapor deposition.

What is clearly needed are new processes for chemical vapor deposition to accomplish the needs of the industry in the several areas described, as the existing methods are not adequate.

SUMMARY OF THE INVENTION

In a preferred embodiment of the present invention a method for depositing Tungsten Nitride (WNx) using $NF_3$ as a source of nitrogen is provided, comprising steps of (a) exposing a substrate surface to be coated in a CVD chamber, maintaining temperature of the substrate in a range of 300 to 450 degrees centigrade, inclusive; (b) flowing $WF_6$ into the CVD chamber at a flow rate between 3 and 12 sccm inclusive; (c) flowing $NF_3$ into the CVD chamber at a flow rate between 1.5 and 15 sccm inclusive; (d) flowing $H_2$ into the CVD chamber at a flow rate between 200 and 500 sccm inclusive; (e) pumping the chamber to maintain a total pressure of from 50 to 500 mtorr; and (f) striking a plasma in the CVD chamber using a plasma power supply at a power level of from 50 to 300 watts inclusive. In different embodiments films of different thickness are produced by maintaining conditions listed for different lengths of time.

In some embodiments, in steps (b), (c) and (d) the elements are flowed to a premixing apparatus, and thence to the CVD chamber. In others there is a step for flowing argon to the CVD chamber to aid in supporting the plasma of step (f).

In another aspect of the invention a process for producing a substantially pure tungsten film is provided, comprising steps of (a) producing first a substantially amorphous tungsten nitride film on a substrate; (b) placing the substrate in a rapid thermal anneal (RTA) apparatus; and (c) establishing an ambient atmosphere other than substantially pure nitrogen or pure argon in the chamber, and annealing the tungsten nitride film by RTA at a temperature at or below 900 degrees centigrade. The other than substantially pure nitrogen or pure argon may comprise nitrogen with at least 5% hydrogen, or argon with at least 5% hydrogen, or $H_2O$ vapor with at least 5% hydrogen, or other mixtures of gases with hydrogen.

In yet another embodiment of the invention a process for controlling particle formation in a chemical vapor deposition (CVD) chamber using $WF_6$ and $NH_3$ gases as precursors is provided, comprising steps of (a) injecting the $WF_6$ and $NH_3$ gases separately into the chamber; and (b) controlling the pressure at which the $WF_6$ and $NH_3$ gases meet and mix to less than 1000 mtorr.

In some embodiments there may be a further step for pre-coating walls of the CVD chamber with a hard-anodized aluminum film also substantially crack-free. In others a step for heating walls of the CVD chamber to a temperature between 70 and 90 degrees centigrade inclusive is used. In still other embodiments both steps for heating walls of the CVD chamber to a temperature between 70 and 90 degrees centigrade inclusive, and for pre-coating walls of the CVD chamber with a hard-anodized aluminum film also substantially crack-free may be used.

In still another embodiment of the present invention a process for controlling particle formation in a chemical vapor deposition (CVD) chamber using $WF_6$ and $NH_3$ gases as precursors is provided, comprising steps of (a) injecting the $WF_6$ and $NH_3$ gases into the CVD chamber; and (b) heating walls of the CVD chamber to a temperature between 70 and 90 degrees centigrade inclusive during CVD processing. There may be a further step in alternative embodiments for pre-coating walls of the CVD chamber with a hard-anodized aluminum film also substantially crack-free. In still other embodiments there may be another step for injecting the gases separately and controlling the pressure at the point of mixing to less than 1000 mtorr. In yet other embodiments there may be two further steps one for pre-coating walls of the CVD chamber with a hard-anodized aluminum film also substantially crack-free, and the other injecting the gases separately and controlling the pressure at the point of mixing to less than 1000 mtorr.

In still another embodiment a process for controlling particle formation in a chemical vapor deposition (CVD) chamber using $WF_6$ and $NH_3$ gases as precursors is provided, comprising steps of (a) injecting the $WF_6$ and $NH_3$ gases into the CVD chamber; and (b) pre-coating walls of the CVD chamber with a hard-anodized aluminum film also substantially crack-free. In alternative embodiments there may be another step for injecting the gases separately and controlling the pressure at the point of mixing to less than 1000 mtorr. In other alternative embodiments there may be a further step for heating walls of the CVD chamber to a temperature between 70 and 90 degrees centigrade inclusive during CVD processing. In still other embodiments both steps, one for injecting the gases separately and controlling the pressure at the point of mixing to less than 1000 mtorr, and the other for heating walls of the CVD chamber to a temperature between 70 and 90 degrees centigrade inclusive during CVD processing may be incorporated.

In still another embodiment a process for depositing Tungsten Nitride (WNx) using NH3 as a source of nitrogen is provided, comprising steps of (a) exposing a substrate surface to be coated in a CVD chamber, maintaining temperature of the substrate in a range of 300 to 450 degrees centigrade, inclusive; (b) flowing $WF_6$ $NH_3$, and $H_2$ into the CVD chamber; and (c) striking a plasma in the CVD chamber. In this process in some embodiments the substrate temperature is maintained in a range of from 300 to 450 degrees centigrade, the $WF_6$ is flowed to the chamber at from 3–12 sccm inclusive, the $NH_3$ is flowed to the chamber in a range of from 1.5 to 24 sccm, the $H_2$ is flowed to the chamber at from 200 to 500 sccm, and the chamber is pumped to maintain the total pressure below 1000 torr. In some embodiments the plasma may be pulsed.

In still another embodiment a process for forming a tungsten nitride film on an oxide surface of a substrate, with a graded interface of tungsten silicide at the oxide surface is provided, comprising steps of (a) heating a substrate having an oxide surface to a temperature of from 500 to 600 degrees Centigrade in a reactor chamber; (b) flowing $WF_6$, $NH_3$, $H_2$ and $SiH_4$ into a reactor chamber; and (c) pumping the chamber to maintain a total pressure of from 100 to 500 mtorr. In this embodiment $WF_6$ may be flowed into the chamber at from 3–12 sccm inclusive, $NH_3$ may be flowed into the chamber at from 1.5 to 50 sccm, and $H_2$ may be flowed into the chamber at from 200 to 500 sccm.

The process improvements taught in enabling detail in the descriptions herein and below provide contributions in the art for improving processes in chemical vapor deposition for processes related t tungsten nitride, and afford new and better ways for manufacturers to produce integrated circuits.

BRIEF DESCRIPTION OF THE DRAWING FIGURES

DESCRIPTION OF THE PREFERRED EMBODIMENT

Figure 1:
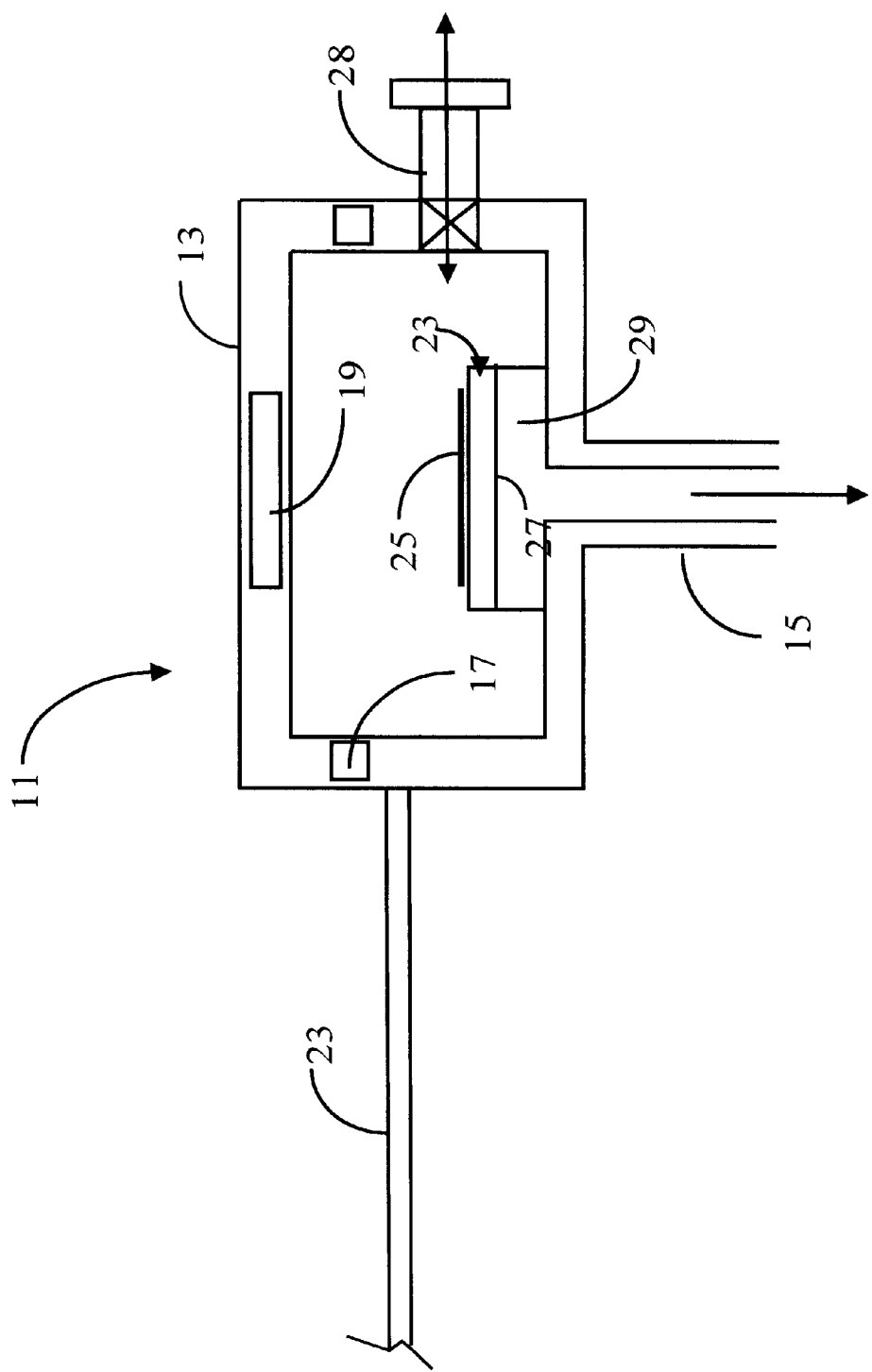
FIG. 1 is a cross-section elevation view of a single wafer CVD deposition reactor for practicing the present invention.

FIG. 1 is a simplified cross-section elevation view of a single wafer CVD reactor chamber 11 for practicing the present invention. Single wafer chambers are highly desirable in current art for adaptation to processing systems known generally as cluster tools, wherein one wafer at a time may be moved through vacuum load locks and sequentially through a number of individual processes before again being exposed to air. Pick-and-place transfers, not shown in FIG. 1, operating in a transport volume maintained at a high vacuum level, move wafers from one chamber to another for processing, and the individual processing chambers are isolated from the transport volume during processing. In FIG. 1 transfer of wafers is made through valved port 28. A number of such machines are known to the inventors, and among them is the Genus Series 7000™ machines, made by Genus, Inc. of Sunnyvale, Calif.

In the reactor of FIG. 1 a hermetically sealed chamber 13 is pumped through a pumping port 15 by a vacuum pumping system not shown, and gaseous process material are introduced via a manifold arrangement 17 and a showerhead manifold arrangement 19 from a remote gas supply system through manifolding 23. The showerhead is typically electrically isolated from other metallic portions of the chamber, and may be grounded or connected to high-frequency power supplies for electrical biasing. A gas-mixing manifold (not shown) in this arrangement ensures that gases introduced into the showerhead manifold are thoroughly mixed.

Susceptor 23 is the CVD hearth in this embodiment, and supports a wafer 25 for processing. The hearth, and hence the wafer, is heated by a plate heater 27 within an enclosure volume 29, and arrangements provide for an ability to flow gases into this volume and onto the backside of a wafer during processing. Susceptor 23 is also electrically isolated and may be either grounded or biased as desired, such as by a high frequency power supply not shown. Various sensors for measuring process parameters such as temperature and pressure are also interfaced with the CVD reactor, although not specifically shown in FIG. 1.

CVD reactor 11 depicted in FIG. 1 is well suited for conducting CVD processes according to the present invention. It will be apparent to those with skill in the art, however, that the invention is not limited to the reactor shown, and may be practiced in a wide variety of CVD reactors, including those reactors known as batch reactors in the art, wherein several wafers at a time are transferred into a reactor chamber, and processed in the reactor simultaneously.

CVD Process for Deposition of Tungsten Nitride as Low-Resistance Gate Material

In some applications, such as low resistance gates, a low-fluorine content in the barrier film is desired. In the case of a low-resistance gate, high fluorine content greater than $\sim 10^{19}$ atoms per $cm^3$ can have a detrimental effect on the electrical characteristics of the capacitor formed by the structure. This effect adds an additional variability, which is desirable to eliminate if possible.

It is known to the inventors that there are several chemistries possible for producing tungsten nitride in a CVD process these are:

  (1)

  (2)

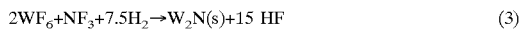  (3)

In current art $WF_6$ with $NH_3$ is the most common chemistry for Tungsten Nitride thin films by CVD or PECVD, but, because of drawbacks previously discussed, an undesirable process. There is, as also described above, a serious drawback to this chemistry. That is the fact that mixing these two gases at room temperature causes an instantaneous and highly exothermic reaction. This fact leads to considerable complications in CVD reactor design and operation. The undesirable gas phase reactions, even where the gases are not premixed, causes particulate formation, powdery deposits, coating of chamber walls, and to poor film adhesion to the substrate. For these reasons such processes are not seriously considered as serious, viable processes in industry at the present.

In all of the above reactions it is obvious that a lot of fluorine is available for incorporation due to $WF_6$. It would appear to most skilled practitioners in the art of thin film deposition that reaction (3) is likely to lead to the most F incorporation in the film because of the addition of nitrogen trifludride ($NF_3$). Indeed $NF_3$ broken down by plasma is commonly used to generate fluorine to etch tungsten deposits from the process chamber. Therefore, reaction (3) above has been proposed in the art, but never demonstrated, and the tendency in the art has been away from this process for exactly the reason of surplus fluorine.

The inventors have found that thermal CVD using $NF_3$ in reaction (3) is not very reactive. No significant formation of tungsten nitride at temperatures up to at least 600° C. has been observed, although there may be deposition at even higher temperatures. Much higher temperatures, however, would be a serious drawback for a viable commercial process. However, with the addition of plasma, high quality amorphous tungsten nitride films have been deposited at lower temperatures at rates of 20 to 60 nm/min. The typical process ranges for this exemplary process are:

TABLE I (Gate Application)

| Parameter | Units | Range |
|---|---|---|
| Total Pressure | mtorr | 50–500 |
| Plasma Power | Watts | 50–200 |
| Temperature | ° C. | 300–450 |
| $WF_6$ | sccm | 3–12 |
| $NF_3$ | sccm | 1.5–24 |
| $H_2$ | sccm | 200–500 |

Figure 2:
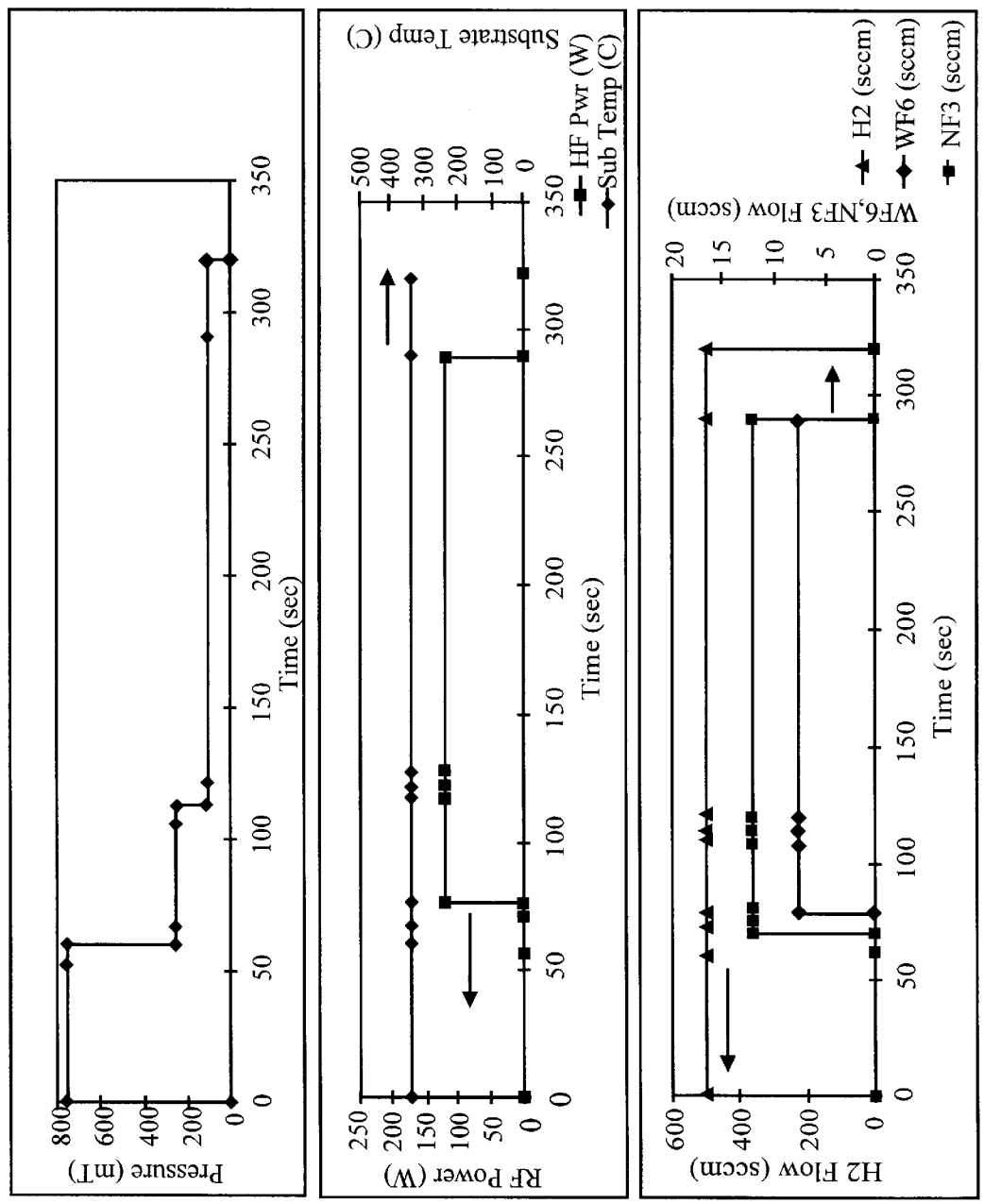
FIG. 2 is a process diagram for deposition of $WN_x$ in an embodiment of the present invention, with plasma enhancement.
Figure 3:
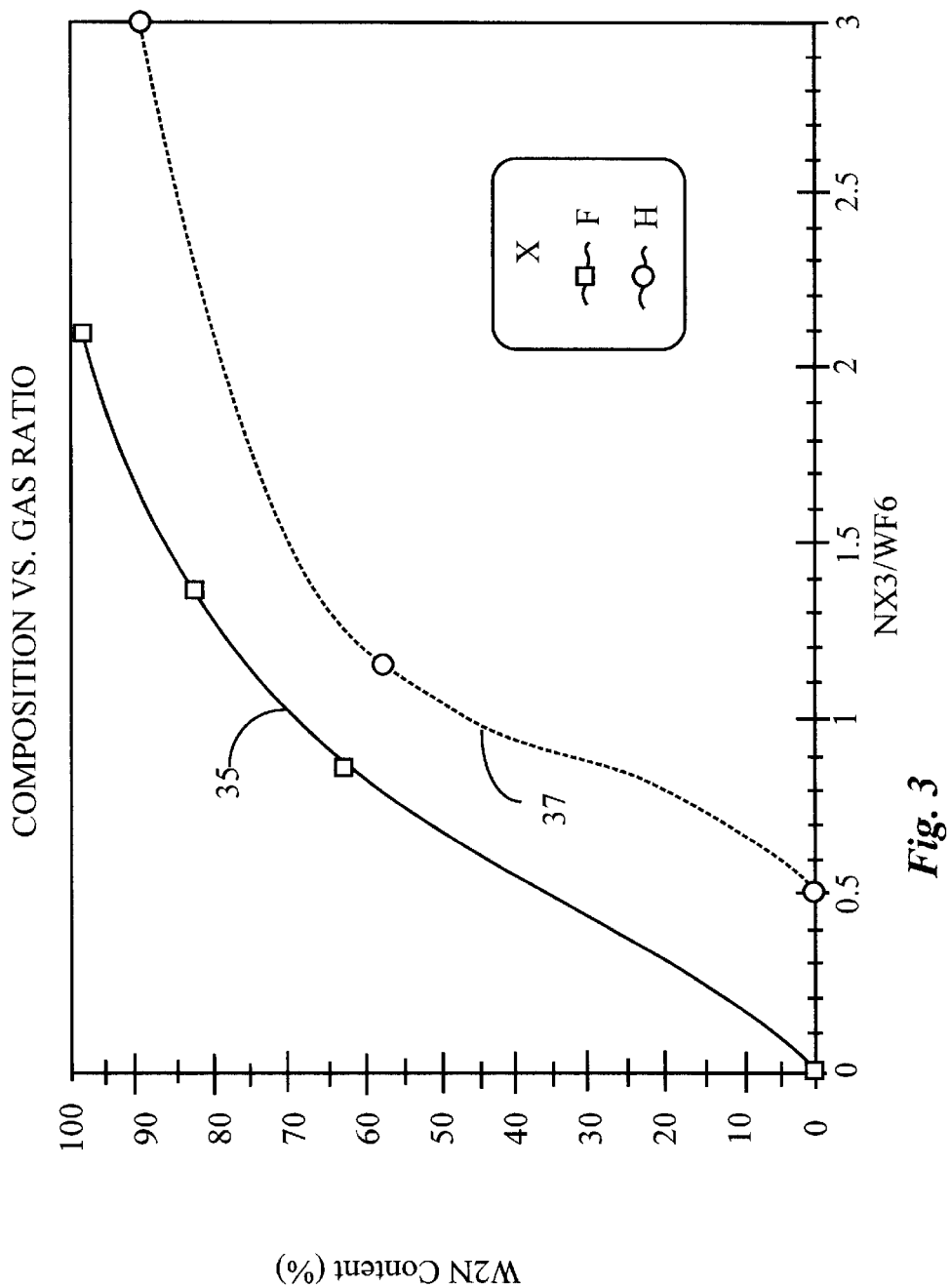
FIG. 3 is a graph of film content for tungsten nitride films made with $NF_3$ chemistry according to an embodiment of the present invention, and with conventional $NH_3$ chemistry.

In addition to the above Table I, FIG. 2 shows a particular process verified by the inventors within the ranges of Table I.

Three important improvements have been observed if $NF_3$ is used as a nitrogen source compared to $NH_3$ under the same conditions described above:

1) An approximately 2 times increase in the effectiveness in the utilization of the nitrogen gas
2) An increase of the number of wafer depositions from less than 50 to over 400 before the process chamber needs cleaning to reduce particles
3) An approximately 2 order of magnitude decrease in fluorine level The above methods and benefits obtained with the exemplary $NF_3$ were are not obvious to those skilled in the art since no actual deposition results have been demonstrated prior to our discoveries, or reported in the literature. Only after obtaining the surprising results were the inventors able to realize that the improvements can be explained by the elimination of a direct reaction between $WF_6$ and $NH_3$.

The plasma enhanced CVD process described above involving $NF_3$ may be modified by an addition of an inert gas such as Helium or Argon. It is well known that a deposition plasma consists of highly energetic free electrons that are necessary to sustain a plasma. In $NF_3$, the highly electronegative character of F tends to extract electrons from the plasma and make it unstable. Such plasma instabilities in turn tend to adversely affect the PECVD process repeatability and also film uniformity. Addition of an inert gas such as He or Ar (preferably Ar) supplies electrons by ionization in the plasma. The mechanism is described below:

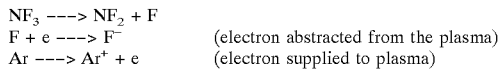

| $NF_3 \longrightarrow NF_2 + F$ | |
|---|---|
| $F + e \longrightarrow F^-$ | (electron abstracted from the plasma) |
| $Ar \longrightarrow Ar^+ + e$ | (electron supplied to plasma) |

It will be understood by those with skill in the art that the addition of inert gas into the chamber to support a plasma for PECVD processing is well known in the art.

A significant advantage of $NF_3$ chemistry in the present disclosure is the co-reduction characteristic as described above. Because each of the desired products of the composite films is formed in an essentially independent chemical reaction, control of film composition is straightforward and predictable.

The inventors have also have discovered, as an added advantage in the $NF_3$ process, that $NF_3$ chemistry is more efficient than $NH_3$ chemistry for providing nitrogen in the desired film. FIG. 8 is a graph prepared from experimental data collected in practicing the tungsten nitride $NF_3$ processes described above and in practicing conventional tungsten nitride $NH_3$ processes. As is well known in the art from the conventional processes, the films prepared are a mixture of tungsten and tungsten nitride ($W_2N$) after annealing. The ordinate in the graph represents film content by percent for materials represented in the graph, while the abscissa represents the ratio of nitrogen-bearing gas in the process (either $NH_3$ or $NF_3$) to tungsten hexafluoride ($WF_6$).

Curve 35 indicates $W_2N$ percent content for the unique $NF_3$ process of the present invention, and curve 37 represents $W_2N$ percent for conventional $NH_3$ processing. It is readily apparent that the $W_2N$ content increases more rapidly for the unique $NF_3$ process than for the conventional process. For example, a 50% level is reached for $NF_3$ processing at a ratio of about 0.6, while for conventional $NH_3$ processing a ratio of about 1.1 is needed for a 50% level.

Low Temperature Conversion of WNx to W

Rapid Thermal Annealing (RTA) is known in the art to anneal tungsten nitride in an ambient gas to reduce the Nitrogen and Fluorine to form pure W. Converting WNx to pure W through RTA is more successful, in terms of quality, than directly depositing pure W on the substrate. A temperature of approximately 1000° C. is required for about 60 seconds to fully convert WNx to W in known processes. In this process, an N2 ambient gas is employed.

Using the PECVD process for tungsten nitride described above allows a much purer (lower Nitrogen and Fluorine) amorphous WN film to be deposited on a substrate than has been possible by previous CVD processes, and this starting point helps in further annealing to form pure tungsten.

Further to the above, the inventors have discovered that inclusion of at least 5% H2 in an ambient such as Argon (Ar), Nitrogen or water vapor reduces the temperature requirement for the annealing from 1000° C. to a range of 850° C. to 900° C. for the same time period (about 60 seconds).

Moreover, by starting with an amorphous tungsten nitride layer preferably formed by the $NF_3$ process described above, and adjusting the annealing ambient to a lower nitrogen content, for example 10% hydrogen with the balance argon, a built-in barrier is self-formed. The barrier is either tungsten nitride or tungsten-silicon-nitride with a layer thickness of from about 10 to 30 Angstroms. The rest of the film is pure tungsten with resistivity about 10–15 micro-ohm cm.

Particle Control for WNx Deposition Using $WF_6$ and $NH_3$

It has been taught above that NF3 may be used successfully in place of $NH_3$ for eliminating gas phase reactions in both CVD and PECVD processes wherein the deposition film is WNx. As described above there exists a direct and kinetically-favored reaction between $WF_6$ and $NH_3$ without the need for $H_2$. This reaction occurs spontaneously and exothermically even at room temperature. If $WF_6$ and $NH_3$ are allowed to mix at 10 torr and room temperature, the mixing point will easily reach temperatures above 100° C. The result is a white solid powder consisting of fluorinated tungsten complex containing W, N, F, and H. The ability to form solid particles from a gaseous mixture is why reaction (2), shown above, is considered in the art to be a "dirty-"chemistry not suitable for manufacturing integrated circuits.

The tendency to form a direct CVD reaction is, however, a favorable trait to accomplish a deposition process to conformably coat small features, both with and without plasma. The present inventors have therefore developed methods to take advantage of the potential for conformal coating of small features with reaction (2) by finding solutions to the particulate formation.

To combat the particulate formation tendencies of the gas phase reaction using $NH_3$ the inventors have undertaken several steps, as follows:

1) Process chamber wall coating by a 0.5 mil hard-anodized aluminum oxide layer especially developed to not have any cracks that allow fluorine attack. Hard anodized films substantially above 0.5 mil typically form microcracks allowing an exposed aluminum surface to the process. This layer improves the adhesion of wall coatings thus reducing particles formed by flaking deposits on the chamber walls.

2) Separate injection of $WF_6$ and $NH_3$ that prevents mixing of the two gasses above 1 torr. We have found that a mixing pressures less than 1 torr eliminates formation of particles in the gas phase by direct reaction between $WF_6$ and $NH_3$.

3) Elevating the chamber wall temperature to maintain within a range of from 70–90 degrees centigrade. Counter to expectation that an elevated temperature would enhance wall reactions due to the direct reaction between WF6 and $NH_3$ the elevated temperature actually reduces the amount of wall depositions as evidenced by a increased utilization of $NH_3$ by at least a factor of 2.

The inventors have discovered that each of the steps is beneficial, and combinations of these steps are even more beneficial in reducing particulate formation when using the $NH_3$ process.

In the processes performed according to equation (2) above, the process parameters are preferably within the ranges shown in Table 11 following:

TABLE II

| Parameter | Units | Range |
|---|---|---|
| Total Pressure | mtorr | 50–500 |
| Power | Watts | 50–200 |
| Temperature | ° C. | 300–450 |
| $WF_6$ | sccm | 3–12 |
| $NH_3$ | sccm | 1.5–24 |
| $H_3$ | sccm | 200–500 |

High Step Coverage Low-Temperature Deposition

The inventors have determined that reaction (2) does not react fully to form a good quality $W_2N$ unless the reaction temperature is above 500° C. For some applications, notably with devices with copper metalization, deposition temperatures less than 400° C. are required. Plasma enhanced chemical vapor deposition (PECVD) is used in such processes according to the invention to drive reaction (2) very efficiently at temperatures above about 290° C. If the wafer temperature is maintained between 300 and about 450° C. as seen in Table II, an amorphous $WN_x$ (x=0.2 to 0.5) film results. The amorphous morphology is inherently a good characteristic for reducing diffusion due to film defects and grain boundaries. However, PECVD processes do not typically exhibit ability to coat small features conformably. The inventors discovered that when the utilization of the $NH_3$ was increased through controlling the wall temperature to 70–90 degrees centigrade the step coverage was also enhanced. Step coverage of 30% in a 9:1 (depth:width) trench structure has been obtained under the conditions described in table II when combined with a wall temperature of 70–90 degrees centigrade. This result is much improved over a process where the wall temperature is nominal room temperature, 30 degrees centigrade, and $NH_3$ is utilized less efficiently Improving Nucleation of CVD Deposited WN on Oxide Surfaces As scaling of integrated circuits to smaller and smaller dimensions continues, dielectric layers also must become thinner to concomitantly increase the capacitance per unit area. This leads to need for of high capacitance layers, such as $Ta_5O_5$. Tungsten bonds less strongly to nitrogen or oxygen than titanium or tantalum, which leads to the potential of using the tungsten nitride as a barrier layer in this application.

However, in the new metal to dielectric structures that are desired by the industry, there needs to be a very thin barrier layer with high ability to coat small features. A significant challenge is that this thin layer will also have to be able to deposit directly on an underlying oxide and also without attacking silicon used to contact the barrier.

The inventors have developed a method that can be used to deposit a 25 to 50 nm thin tungsten nitride layer using a thermally activated version of reaction (2) by first forming a thin mono-layer to 6nm tungsten silicide nucleation layer. The typical temperature of 525° C. required for the efficient use of reaction (2) is well outside the range of parameters that most would consider feasible for using silane ($SiH_4$) to form a tungsten silicide. Typically silane deposited tungsten silicide is deposited at only 390° C. or less.

Table IV shows the parameter ranges for the process to perform the thin tungsten silicide layer changing quickly to tungsten nitride:

TABLE IV (Capacitor Electrode Silicide Nucleation)

| Parameter | Units | Range |
|---|---|---|
| Total Pressure | mtorr | 100–500 |
| Temperature | ° C. | 500–600 |
| $WF_6$ | sccm | 0.1–5 |
| $NH_3$ | sccm | 0–20 |
| $H_3$ | sccm | 200–500 |
| $SiH_4$ | sccm | 20–50 |

In order to combat this problem, the inventor provides a method that uses $SiH_4$ to reduce the $WF_6$ in the gaseous phase. In this method, a thin Tungsten silicide layer forms on the oxide surface. After the layer is completely formed on the oxide surface, conformal deposition of WNx by CVD may commence.

It will be apparent to those with skill in the art that there are many alternative to the embodiments of the invention as described above without departing from the spirit and scope of the invention. For example, there are a variety of reactors that might be used, including both single-chamber and batch reactors. There are process variations that may be made as well, including variations in preparatory and finishing steps before and after the principle deposition step in each exemplary process, and there are broad ranges, as have been detailed above, of process characteristics within which successful process has been demonstrated and may be repeated. As there are many such variations within the spirit and scope of the invention, the invention is limited only by the claims which follow:

What is claimed is:

1. A process for controlling particle formation in a chemical vapor deposition (CVD) chamber using $WF_6$ and $NH_3$ gases as precursors, comprising steps of:
    (a) pre-coating walls of the CVD chamber with a hard-anodized aluminum film substantially crack-free;
    (b) injecting the $WF_6$ and $NH_3$ gases separately into the chamber; and
    (c) controlling the pressure at which the $WF_6$ and $NH_3$ gases meet and mix to less than 1000 mtorr.

2. The process of claim 1 comprising a further step for heating walls of the CVD chamber to a temperature between 70 and 90 degrees centigrade inclusive.

3. The process of claim 1 comprising two further steps, one for heating walls of the CVD chamber to a temperature between 70 and 90 degrees centigrade inclusive, and the other for pre-coating walls of the CVD chamber with a hard-anodized aluminum film also substantially crack-free.

4. A process for controlling particle formation in a chemical vapor deposition (CVD) chamber using $WF_6$ and $NH_3$ gases as precursors, comprising steps of:
    (a) injecting the $WF_6$ and $NH_3$ gases into the CVD chamber; and
    (b) heating walls of the CVD chamber to a temperature between 70 and 90 degrees centigrade inclusive during CVD processing.

5. The process of claim 4 comprising a further step for injecting the gases separately and controlling the pressure at the point of mixing to less than 1000 mtorr.

6. A process for controlling particle formation in a chemical vapor deposition (CVD) chamber using $WF_6$ and $NH_3$ gases as precursors, comprising steps of:
    (a) injecting the $WF_6$ and $NH_3$ gases into the CVD chamber; and (b) pre-coating walls of the CVD chamber with a hard-anodized aluminum film substantially crack-free.

7. The process of claim 6 comprising a further step for injecting the gases separately and controlling the pressure at the point of mixing to less than 1000 mtorr.

8. The process of claim 6 comprising a further step for heating walls of the CVD chamber to a temperature between 70 and 90 degrees centigrade inclusive during CVD processing.

9. The process of claim 6 comprising two further steps, one for injecting the gases separately and controlling the pressure at the point of mixing to less than 1000 mtorr, and the other for heating walls of the CVD chamber to a temperature between 70 and 90 degrees centigrade inclusive during CVD processing.

10. A process for depositing Tungsten Nitride (WNx) using $NH_3$ as a source of nitrogen, comprising steps of:

(a) exposing a substrate surface to be coated in a CVD chamber, maintaining temperature of the substrate in a range of 300 to 450 degrees centigrade, inclusive;

(b) flowing $WF_6$, $NH_3$, and $H_2$ into the CVD chamber;

(c) striking a plasma in the CVD chamber; and (d) heating the walls to between 70–90 degrees centigrade to promote enhanced step coverage.

11. The process of claim 10 wherein the substrate temperature is maintained in a range of from 300 to 450 degrees centigrade, the $WF_6$ is flowed to the chamber at from 3–12 sccm inclusive, the $NH_3$ is flowed to the chamber in a range of from 1.5 to 24 sccm, the $H_2$ is flowed to the chamber at from 200 to 500 sccm, and the chamber is pumped to maintain the total pressure below 1000 torr.

* * * * *